United States Patent
Yin

(10) Patent No.: US 7,142,013 B2
(45) Date of Patent: Nov. 28, 2006

(54) ONE-LEVEL ZERO-CURRENT-STATE EXCLUSIVE OR (XOR) GATE

(75) Inventor: Guangming Yin, Foothill Ranch, CA (US)

(73) Assignee: Broadcom Corporation, Irvine, CA (US)

(*) Notice: Subject to any disclaimer, the term of this patent is extended or adjusted under 35 U.S.C. 154(b) by 0 days.

(21) Appl. No.: 11/133,723

(22) Filed: May 20, 2005

(65) Prior Publication Data

US 2005/0218984 A1    Oct. 6, 2005

Related U.S. Application Data

(63) Continuation of application No. 10/456,804, filed on Jun. 6, 2003, now Pat. No. 6,930,512.

(60) Provisional application No. 60/424,562, filed on Nov. 6, 2002, provisional application No. 60/424,563, filed on Nov. 6, 2002.

(51) Int. Cl.
*H03K 19/21*    (2006.01)

(52) U.S. Cl. .................................. 326/54; 326/104
(58) Field of Classification Search ............ 326/52, 326/53, 54, 55, 104; 330/253, 254, 261
See application file for complete search history.

(56) References Cited

U.S. PATENT DOCUMENTS 5,250,860 A * 10/1993 Chu et al. ................. 326/60
5,252,865 A * 10/1993 Davenport et al. ........... 327/3
5,391,938 A * 2/1995 Hatsuda ..................... 327/71

* cited by examiner

*Primary Examiner*—Henry Choe
(74) *Attorney, Agent, or Firm*—McAndrews, Held & Malloy, Ltd

(57) ABSTRACT

Aspects of the invention provide a fast one level zero-current-state XOR gate. An embodiment of the invention provides a first pair of differentially configured transistors and a level shifting resistor coupled to the first pair of differentially configured transistors. The one level zero-current-state XOR gate may also include a second pair of differentially configured transistors. A core of the XOR gate may be coupled to outputs of the first and the second pairs of differentially configured transistors.

20 Claims, 8 Drawing Sheets

ONE-LEVEL ZERO-CURRENT-STATE EXCLUSIVE OR (XOR) GATE

CROSS-REFERENCE TO RELATED APPLICATIONS/INCORPORATION BY REFERENCE

This application is a continuation of U.S. application Ser. No. 10/456,804 filed Jun. 6, 2003, now U.S. Pat. No. 6,930,512, which in turn makes reference to, claims priority to and claims the benefit of U.S. Provisional Patent Application Ser. No. 60/424,562 filed on Nov. 6, 2002, and U.S. Patent Application Ser. No. 60/424,563 filed on Nov. 6, 2002.

The above referenced applications are incorporated herein by reference in their entirety.

BACKGROUND OF THE INVENTION

Certain embodiments of the invention relate to communication of signals in optical transmission networks. More specifically, certain embodiments of the invention relate to a method and system for a one-level zero-current-state exclusive OR (XOR) gate.

Synchronous optical network (SONET) and synchronous digital hierarchy (SDH) include a set of related standards that define synchronous data transmission over fiber optic transmission networks. SONET defines a United States (US) version of the standard which is published by the American National Standards Institute (ANSI). However, SDH defines the international version of the standard published by the International Telecommunications Union (ITU). Together, the SONET and SDH standards ensure interconnectivity and interoperability between local and international optical networks and also among conventional and legacy systems.

SONET has a nominal base transmission line rate of 51.84 Mbps, known as optical carrier level one (1) OC-1 or synchronous transport signal level one (1) or STS-1. SONET provides a set of multiples of the base rate known as OC-1, up to a current maximum line rate of 9.953 gigabits per second (Gbps). Notwithstanding, actual line rates in excess of 20 Gbps have be attained. The table below shows the various data rates for SONET and SDH as defined by their respective standards and specifications.

| Optical Level | Electrical Level | Line Rate (Mbps) | Payload Rate (Mbps) | Overhead Rate (Mbps) | SDH |
|---|---|---|---|---|---|
| OC-1 | STS-1 | 51.840 | 50.112 | 1.728 | — |
| OC-3 | STS-3 | 155.520 | 150.336 | 5.184 | STM-1 |
| OC-9 | STS-9 | 466.560 | 451.008 | 15.552 | STM-3 |
| OC-12 | STS-12 | 622.080 | 601.344 | 20.736 | STM-4 |
| OC-18 | STS-18 | 933.120 | 902.016 | 31.104 | STM-6 |
| OC-24 | STS-24 | 1244.160 | 1202.688 | 41.472 | STM-8 |
| OC-36 | STS-36 | 1866.240 | 1804.032 | 62.208 | STM-12 |
| OC-48 | STS-48 | 2488.320 | 2405.376 | 82.944 | STM-16 |
| OC-96 | STS-96 | 4976.640 | 4810.752 | 165.888 | STM-32 |
| OC-192 | STS-192 | 9953.280 | 9621.504 | 331.776 | STM-64 |

The use of SONET in transport networks is fairly widespread and SONET is considered the foundation for the physical layer of broadband ISDN (BISDN). Transport protocols such as the well known asynchronous transfer mode (ATM) runs as a layer on top of SONET as well as other transport technologies. ATM utilizes a cell-based structure consisting of short fixed length packets called cells. These cells may be adapted to facilitate fast efficient packet switching and routing. Accordingly, a received payload may be multiplexed into these cells and quickly routed to its destination. This may be particularly useful in broadband networks that carry diverse content such as voice, video, data and images, some of which may include time critical data and subject to strict latency requirements and/or bandwidth constraints.

Transport networks using SONET and/or SDH may provide more powerful networking capabilities than existing asynchronous systems. Since synchronous transmission networks such as SONET and SDH utilize a highly stable reference clock signal, there is no need to locally align clock signals or provide clock synchronization in order to recover data. Accordingly, it is possible to recover much lower data rates such as digital system one (1) (DS-1), without having to demultiplex an entire bit stream, as would be required for conventional asynchronous transports networks.

SONET and/or SDH may also provide interconnectivity between various network vendor products by providing standardized physical layer interfaces. These standardized interfaces may define parameters such as an optical line rate, tolerable power levels, pulse width, light wave length, and various encoding and decoding algorithms. The standards also provide definitions for framing, including frame format and structure, data overheads and payload mapping. Information in the data overhead may facilitate various functions such as operations, administration, maintenance and provisioning (OAM&P).

While synchronous network systems are suitable for point-to-point communication application, SONET and SDH may be adapted to support point-to-point as well as point-to-multipoint arrangements such as hub configuration. In a hub configuration, for example, a hub may be configured to function as an intermediary for traffic which may be distributed to various network components or entities commonly referred to as spokes for the hub. In this regard, the hub may unify communication between network components and entities connected thereto, thereby eliminating inefficient communication between individual network components and entities. The hub may also reduce requirements for back-to-back multiplexing and help to realize the benefits of traffic grooming.

Traffic grooming may include tasks such as network traffic consolidation or segregation of network traffic which may provide more efficient usage of transmission facilities and bandwidth. The consolidation of traffic may include combining traffic from various locations or sources into one central transport facility. Segregation of network traffic received from various locations may include separating network traffic into its various constituent components and/or various logical and physical criteria. Some communication systems use techniques such as backhauling to reduce expenses associated with repeated multiplexing and demultiplexing. However, grooming may be used to eliminate inefficient methodologies such as backhauling. Although grooming may be done with asynchronous system, it may require various expensive internal and infrastructure changes. However, synchronous networks such as SONET and SDH may be more conducive and adaptable to grooming since traffic data may be segregated at either an STS-1 level or a virtual tributary (VT) level and dispatched to various appropriate system components and/or entities for processing.

In SONET networks, for example, grooming may also be provide segregation of services, which may include any one or more of voice, video, and data. For example, at an interconnection point, an incoming SONET line may contain different types of traffic such as switched, video, voice and/or data. In this case, a SONET network may be conveniently adapted to segregate the switched and non-switched traffic. SONET also includes various options that may be configured to facilitate integrated network OAM&P by providing connectivity between a single maintenance point and various network components or entities. In this regard, a single connection may be configured to reach all network elements within a given architecture, thereby eliminating a need for separate links which may be required for maintaining each and every network component or entity. Particularly, SONET provides overhead data that directly permits OAM&P activities such as remote provisioning. Remote provisioning may provide centralized maintenance and reduced maintenance cost. Since SONET provides substantial overhead information, this information may provide enhanced monitoring and maintenance, along with more efficient diagnostic capabilities which may significantly shorten downtime.

In digital transmission systems, clock signals are critical to system operation since they may be used to keep a constant bit rate and to demarcate the various logic levels in a data stream. Traditionally, transmission systems have been asynchronous with each network component providing its own local clock signal. Since the clocks are asynchronous, transitions of the signals do not necessarily occur at the same nominal rate and large variations may occur in the clock rate, resulting in variable bit rate data signals. In a synchronous system such as SONET, the average frequency of all the clocks in the system will be same or very nearly the same. Accordingly, the frequency of the clocks will be synchronous or plesiochronous. Since every clock in the system may be traced back to a highly stable reference clock signal, a base rate or the STS-1 rate will remain at a nominal 51.84 Mbps allowing many synchronous STS-1 signals to be stacked together without any bit stuffing. Low speed synchronous virtual tributaries (VT) may also be interleaved to create much higher transmission data rates using SONET and SDH. At low speed, for example, DS-1's may be transported by synchronous VT's at a constant rate of approximately 1.728 Mbps.

Additionally, synchronous multiplexing may be done in multiple stages to achieve one of a plurality of desired data rate. Accordingly, a signal such as a synchronous DS-1 may be multiplexed and additional bits such as dummy bit may be added to account for variations which may occur in each individual data stream. Each individual DS-1 data stream may be combined with each other to form a DS-2 stream. This process may be repeated and each individual DS-1 data stream may be further combined with each other to form a DS-3 stream.

Notwithstanding the advantages provided by SONET and SDH, synchronization of information during various stages of processing and transport may affect the performance of SONET and SDH optical transmission systems. In CDR of for example, high speed bi-level synchronous signals, a clock signal having a frequency which may be equivalent to the bit rate, may be extracted from the bit stream. In this regard, the extracted clock signal may be and aligned with data in the bit stream in order to extract the data by sampling. However, an optimal sampling point or required phase alignment of any given synchronous signal may vary depending various conditions, including but not limited, to noise and interference. In various applications such as SONET, it may be crucial to have the recovered clock lock to the a desired position within a data eye of sampled portions of the data in the bit stream. This may be referred to as phase adjustment. In such applications, it may be preferable that a locking position remain constant in the face of a changing data pattern density. Furthermore, performance of any voltage controlled oscillator should not be affected by the phase adjustment.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

Aspects of the invention provide a fast one level zero-current-state XOR gate. In an embodiment of the invention, the fast one level zero-current-state XOR gate includes a first pair of differentially configured transistors and a level shifting resistor coupled to the first pair of differentially configured transistors. The one level zero-current-state XOR gate may also include a second pair of differentially configured transistors. A core of the XOR gate may be coupled to outputs of the first and the second pairs of differentially configured transistors.

A first transistor may be coupled to a third pair of differentially configured transistors and an input of the first transistor may be coupled to a first output of the second pair of differentially configured transistors. A second transistor may be coupled to a fourth pair of differentially configured transistors and an input of the second transistor may be coupled to a second output of the second pair of differentially configured transistors. The first output of the second pair of differentially configured transistors and the second output of said second pair of differentially configured transistors may be differential signals having equivalent magnitude. A first output of said first pair of differentially configured transistors may be coupled to a first input of the third pair of differentially configured transistors and a second input of the fourth pair of differentially configured transistors. A second output of the first pair of differentially configured transistors may be coupled to a second input of the third pair of differentially configured transistors and a first input of the fourth pair of differentially configured transistors.

The first output of the first pair of differentially configured transistors and the second output of the first pair of differentially configured transistors may be differential signals having equivalent magnitude. A drain of the first transistor of the third pair of differentially configured transistors may be coupled to a drain of said first transistor of the fourth pair of differentially configured transistors. An output of the XOR gate may be coupled to the coupled drains of the first transistor of the third pair of differentially configured transistors and the first transistor of the fourth pair of differentially configured transistors.

A drain of the second transistor of the third pair of differentially configured transistors may be coupled to a drain of the second transistor of the fourth pair of differentially configured transistors. The first and second transistors may have a value of about twice the values of each of the first and the second transistors of the third and the forth pair of differentially configured transistors. A first node of the level shifting resistor may be coupled to a bias voltage. A second node of said level shifting resistor may be coupled to the first pair of differentially configured transistors.

Another embodiment of the invention provides a method for controlling an XOR gate. The method may include a coupling a first pair of differentially configured transistors to a core of the XOR gate and coupling a second pair of differentially configured transistors. An output current produced by the core of the XOR gate may be controlled using a level shifting resistor coupled to the first pair of differentially configured transistors. The method may include generating a first differential output from the first pair of differentially configured transistors and a second differential output from the second pair of differentially configured transistors. A value of the level shifting resistor may be selected in order to eliminate an output current produced by the core of the XOR gate when the first and the second different output are equivalent.

These and other advantages, aspects and novel features of the present invention, as well as details of an illustrated embodiment thereof, will be more fully understood from the following description and drawings.

DETAILED DESCRIPTION OF THE INVENTION

Aspects of the invention provide a method and system for a fast one level zero-current-state XOR gate. In an embodiment of the invention, the fast one level zero-current-state XOR gate includes a first pair of differentially configured transistors and a level shifting resistor coupled to the first pair of differentially configured transistors. The one level zero-current-state XOR gate may also include a second pair of differentially configured transistors. A core of the XOR gate may be coupled to outputs of the first and the second pairs of differentially configured transistors.

The fast one level zero-current-state XOR gate may be utilized in a method and system for pattern-independent phase adjustment in a clock and data recovery (CDR) circuit. The CDR may be part of, for example, a system for synchronizing a transceiver and a framer in an optical transmission network. However, the invention is not limited in this regard and may be utilized in numerous other applications. U.S. application Ser. No. 10/456,803 describes a method and system for pattern-independent phase adjustment in a clock and data recovery (CDR) circuit and is incorporated herein by reference in its entirety.

Figure 1:
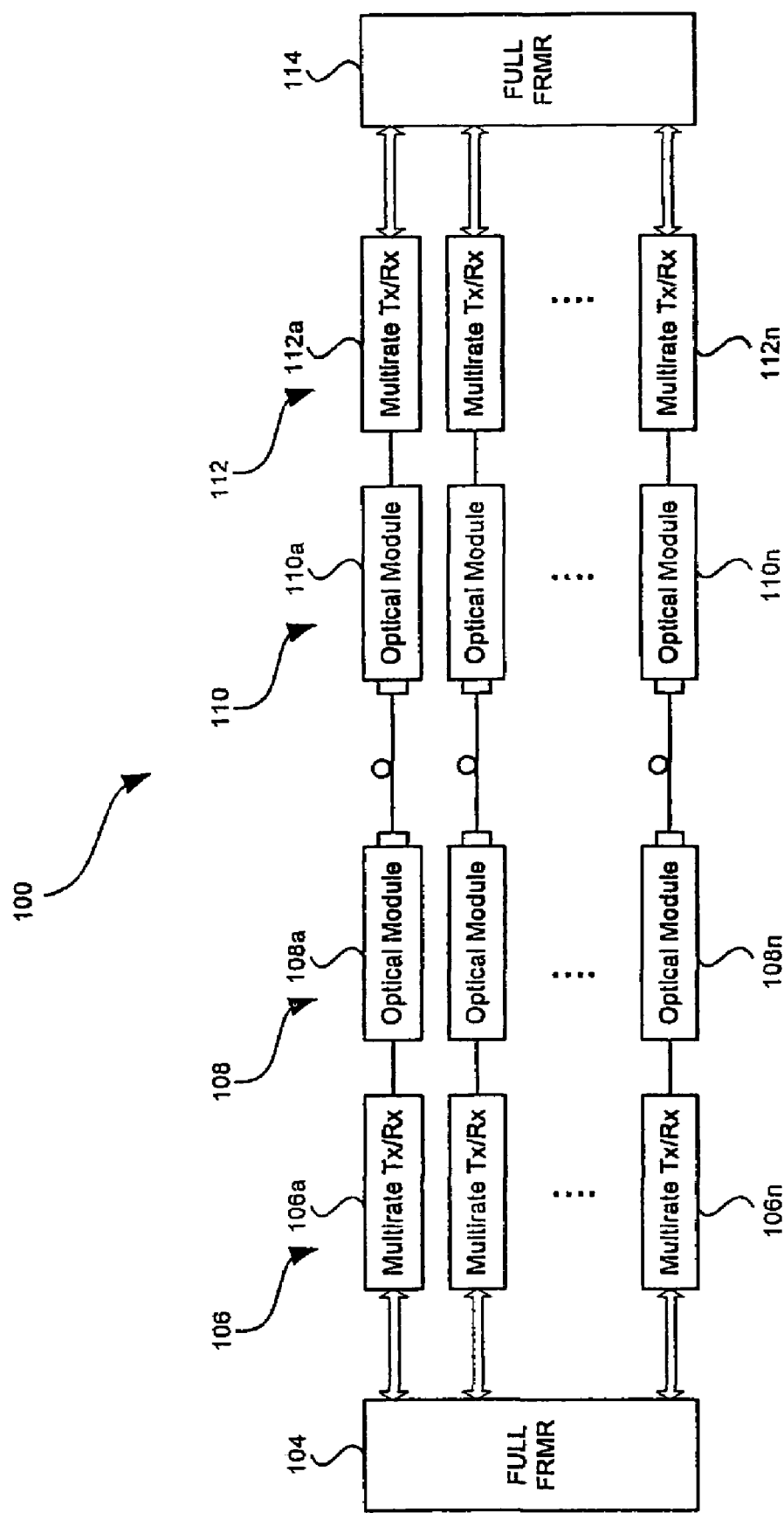
FIG. 1 is a functional block diagram of an exemplary system for synchronizing a transceiver and a framer in an optical transmission network in accordance with an embodiment of the invention.

FIG. 1 is a functional block diagram 100 of an exemplary system for synchronizing a transceiver and a framer in an optical transmission network in accordance with an embodiment of the invention. Referring to FIG. 1, there is shown a first full framer 104, a second full framer 114, a plurality of multiple rate transceivers 106a . . . 106n collectively referenced as 106, a plurality of multiple rate transceivers 112a . . . 112n collectively referenced as 112, and a plurality of optical modules 108a . . . 108n collectively referenced as 108. The full framers 104, 114, multiple rate transceivers 106, 112, optical modules 108, 110, may be coupled as part of a SONET, SDH, Fibre Channel and/or Gigabit Ethernet communication system. In one embodiment of the invention, each one of the multiple rate transceivers 106, 112 may be adapted to recover serial clock and data from an inbound communication signal and provide synchronization and rudimentary function such as loss-of-signal (LOS) detection, out-of-frame detection (OOF), loss-of-frame detection (LOF), and performance monitoring.

Figure 2:
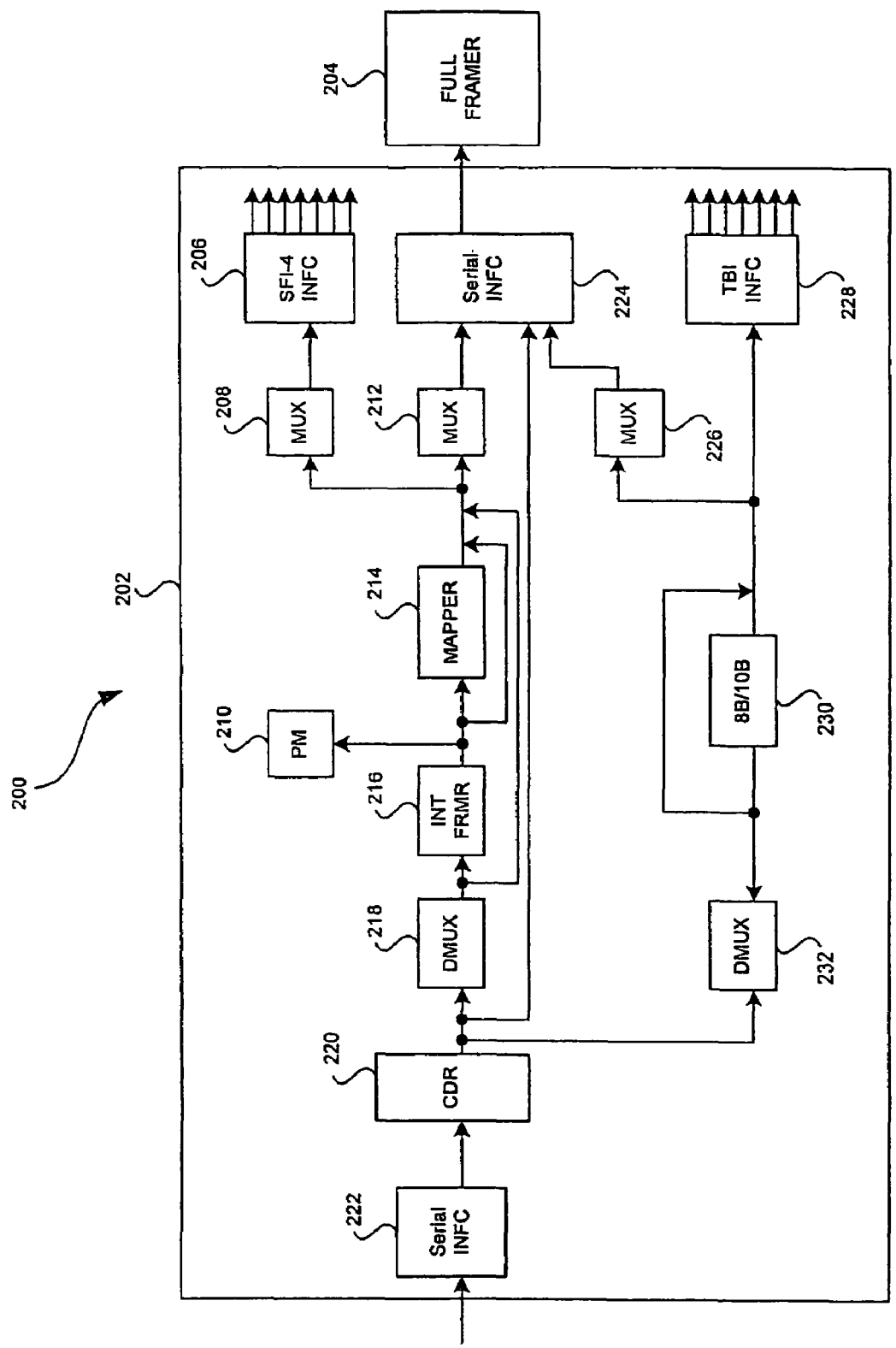
FIG. 2 is a block diagram of an inbound side of an exemplary multiple rate transceiver of FIG. 1 in accordance with an embodiment of the invention.

FIG. 2 is a block diagram 200 of an inbound side of an exemplary multiple rate transceiver 202 of FIG. 1 in accordance with an embodiment of the invention. Referring to FIG. 2, the multiple rate transceiver 202 may include serial interface block 222, clock and data recovery (CDR) block 220, demultiplexers (DMUXs) 218, 232, an internal framer (INT FRMR) 216, protocol performance monitoring block (PM) 210, a mapper 214, multiplexers (MUXs) 212, 208, 226, serial/deserializer interface (SFI-4) block 206, 8-bit/ 10-bit (8B/10B) decoder block 230 and a ten bit (10-bit) interface block 228.

The multiple rate transceiver 202 may be coupled to full framer 204 which may be located externally to the multiple rate transceiver 202. The multiple rate transceiver 202 may include the following components: serial interface block 222, clock and data recovery (CDR) block 220, demultiplexers (DMUXs) 218, 232, internal framer (INT FRMR) 216, protocol performance monitoring block (PM) 210, mapper 214, multiplexers (MUXs) 212, 108, 226, serial/ deserializer interface (SFI-4) block 206, and ten bit (10-bit) interface block (TBI) interface block 228. These components may be integrated into an integrated circuit (IC). In this regard, various pins, whether general purpose or specialized, may be coupled to one or more of the serial interface block 222, clock and data recovery (CDR) block 220, demultiplexers (DMUXs) 218, 232, internal framer (INT FRMR) 216, protocol performance monitoring block (PM) 210, mapper 214, multiplexers (MUXs) 212, 208, 226, serial/deserializer interface (SFI-4) block 206, and ten bit (10-bit) interface block 228 and brought to the surface of the multiple rate transceiver IC.

The CDR 220 may be adapted to receive an inbound serial data steam from the serial interface 222 and recover a serial clock from this inbound data stream. The recovered serial clock may be used to recover data from the inbound data stream. Accordingly, the CDR 220 may include appropriate logic and circuitry that may be adapted to generate a clock signal having, for example, the same frequency as the inbound data bit rate. In this regard, CDR 220 may phase-align inbound data by sampling the data in the center of its data eye pattern. The CDR 222 may be adapted to bit align the received data as part of the data recovery process.

The DMUX 218 may be adapted to receive the bit aligned data which may be in a serial format. Upon receipt of the serial bit aligned data, the DMUX 218 may demultiplex the serialized data into a plurality of parallel data streams to decrease a data rate of the received inbound serialized data stream.

The internal framer (INT FRMR) 216 may be adapted to locate at least a portion of the inbound data stream for each frame containing synchronization data. The synchronization data may be used to demarcate a beginning or start of a valid frame. The internal framer (INT FRMR) 216 may be provide scrambling/descrambling of the demultiplexed serialized data, data communication channel bytes D1, D2, and D3 (DCC(D1–3)/E1/F1) insertion and extraction, J0, Z0 bytes processing including, insertion and extraction, and B1 performance monitoring. An OC-3/OC-12/OC-48 receiver interface may be integrated into the internal framer (INT FRMR) 216 may configured to provide an OC-3/OC-12/OC-48 mapping function, B1 error detection, standardized framing and descrambling.

The mapping function may be configured, for example, to map OC-3/OC-12/OC-48 into an STS-48 formatted signal. J0 and Z0 bytes may be optionally a part of the overhead and may be used to carry, for example section trace messages. For example, J0 bytes used to carry section information may be stored in a message buffer by, for example, a trace processor or host microprocessor in a 16-byte or 64-byte format. Accordingly, information stored in the message buffer may be read out of the message buffer and inserted into the J0 byte. The J0 byte may be configured to operate in either a pass through or insertion mode. In the pass through mode of operation, the J0 byte may be adapted to remain untouched, while in the insertion mode, trace information may be read from the message buffer and inserted into the J0 byte. The Z0 byte may be configured to operate in one of a plurality of modes. For example, the Z0 byte may be set to a binary number corresponding to its order of appearance in for example, an STS-48 frame. The Z0 byte may also be set to a user programmer constant byte.

The internal framer (INT FRMR) 216 may be configured to selectively modify a section overhead of a frame without changing a signaling rate on an incoming or inbound data stream. Accordingly, upon receipt and detection of a frame, the internal framer (INT FRMR) 216 may also be adapted to determine the validity of a frame in order to ensure that realignment may be achieved by for example, the full framer 204. This information may be relayed to the full framer 114.

The 8B/10B decoder block 230 may be adapted to perform error checking and handling. In this regard, the 8B/10B decoder block 230 may receive an 10-bit formatted inbound data stream at a frequency of, for example, 125 MHz. The 8B/10B decoder block 230 may attempt to gain synchronization by searching the inbound data stream for a synchronization pattern, for example, a special COMMA code group. Upon achieving synchronization, the 8B/10B decoder block 230 may validate code groups and perform disparity checks. The 8B/10B decoder block 230 may include one or more counters that may be utilized for collecting and storing invalid code groups and running disparity errors. Subsequently, the 8B/10B decoder block 230 may encode 8-bit formatted data into 10-bit formatted data.

The TBI interface block 228 provides compatibility with devices that have been manufactured by a plurality of different vendors. In general, TBI interface block 228 may be adapted to interconnect a PCS sublayer and a PMD sublayer of a physical layer (PHY) device. The TBI interface block 228 may be adapted to receive 10-bit formatted data and convert the 10-bit formatted data into other formats suitable for use by, for example, other PHY devices.

In operation, CDR 220 may receive an inbound serial formatted data stream from the serial interface 222. CDR 220 may recover a clock and data signals from the received data. The recovered data signals, which may be serially formatted, may be demultiplexed by DMUX 218. In this regard, the DMUX 218 may transform serially received data into a plurality of parallel data streams. The internal framer (INT FRMR) 216 may receive the parallel data streams and may execute a frame search in order to acquire synchronization. During frame search, the internal framer (INT FRMR) 216 may execute a search for a frame demarcation along, for example, bit boundaries of inbound 16-bit formatted data. In this regard, the internal framer (INT FRMR) 216 may be adapted to search for, for example, a 32-bit pattern 0xF6F2828 delineating the synchronization and start of a SONET frame. Other protocols may utilize other synchronization patterns and the internal framer (INT FRMR) may be configured to search for those synchronization patterns.

In accordance with an embodiment of the invention, the internal framer (INT FRMR) 216 may be adapted to locate two consecutive synchronization patterns indicating the start of two consecutive frames. In the case of a SONET frame, the internal framer (INT FRMR) 216 may be adapted to locate two consecutive 0xF6F2828 patterns indicating the start of two consecutive frames, before it will report the identification of a valid frame.

Once the internal framer (INT FRMR) 216 detects a synchronization frame, it may continue to monitor the inbound stream for framing errors by, for example, executing a 12-bit check on the aligned output data. If, for example, four (4) consecutive frames contain one or more frame bit errors, the out of frame condition may be declared and a new frame synchronization search may be initiated. One or more bits in a register associated with the internal framer (INT FRMR) 216 and/or the multiple rate transceiver 202 may be adapted to report an out of frame condition. The register may be internal to the internal framer (INT FRMR) 216 or externally coupled thereto. Additionally, an interrupt signal may be generated to indicate an out of frame condition.

In accordance with an embodiment of the invention, an out of frame (OOF) condition may be declared if the internal framer (INT FRMR) 216 is not able to locate two consecutive frames within a specified time interval of about 250 μs, for example. One or more bits in an internal register of the internal framer (INT FRMR) 216 and/or the multiple rate transceiver 202 may be adapted to indicate the out of frame condition. In an alternative embodiment of the invention, at least a portion of the synchronization pattern may be used to detect the second of two consecutive frames. Hence, in the case of SONET where the synchronization frame consists of 32 bits, 24 bits of the synchronization pattern may be used to determine the second of two consecutive frames.

The internal framer (INT FRMR) 216 may be adapted to determine and report any loss of signal (LOS) detected by the multiple rate transceiver 202. The internal framer (INT FRMR) 216 may include a loss of signal detection block that may be adapted to monitor the scrambled data of the inbound data stream for the absence of logic ones (1s). If, for example, a 20 μs interval or other appropriate time interval of consecutive logic zero (0) is detected, a LOS condition may be declared. However, the interval is not limited to 20 μs, and other intervals may be utilized without departing from the spirit of the invention. One or more bits in an internal register associated with the internal framer (INT FRMR) 216 and/or the multiple rate transceiver 202 may be adapted to indicate the loss of signal condition. The register may be internal to the internal framer (INT FRMR) 216 or externally coupled thereto. Once the internal framer (INT FRMR) 216 identifies a first synchronization pattern, the framer may align its internal frame counter and align the output data on, for example, byte boundaries of the inbound data stream. If a valid synchronization pattern is located exactly one frame after the prior detected frame, the out of frame condition may be released.

In an embodiment of the invention, after acquiring synchronization, the internal framer (INT FRMR) 216 may notify or inform a downstream device such as fill framer 204 that it has attained synchronization. In this regard, the internal framer (INT FRMR) 216 may include one or more external pins and/or registers that may be utilized to notify or inform the downstream device that synchronization has been achieved. In a case where the internal framer (INT FRMR) 216 utilizes an external pin to notify or inform the downstream device, the downstream device may be coupled to the external pin of the internal framer (INT FRMR) 216. An electrical or optical conduit may be used to couple the downstream device to internal framer (INT FRMR) 216. Hence, whenever the internal framer (INT FRMR) 216 achieves synchronization, it may, for example, assert a signal on its external pin and the asserted signal may be transferred via the electrical or optical conduit and detected by the downstream device. Once the internal framer notifies the downstream device such as the full framer that synchronization has been achieved, the down stream device does not need to resynchronize to the inbound data stream. Upon receipt of inbound data by the full framer, since no synchronization may be necessary, the full framer may immediately start processing any inbound data it receives. Accordingly, this may significantly decrease processing time.

The mapper 214 may be configured to receive, for example, OC-3/OC-12/OC-48 inbound data from the internal framer (INT FRMR) 216 and map this inbound received data into, for example, a 16-bit wide 155-MHz interface. The inbound data received from the internal framer (INT FRMR) may be formatted as 16-bit wide data to create an STS-48 formatted frame. The mapper 214 may generate a frame count for the newly mapped STS-48 formatted frame. The generated frame count may be phased to the OC-3/OC-12/OC-48 frame and stored within one or more registers or buffers, from which it may subsequently be extracted and inserted into appropriate time slots in the STS-48 frame. The mapper 214 may include one or more STS-48 counters and/or mapping functions that may be required to create an STS-48 frame. In this regard, the STS-48 counters may receive one or more marks from internal framer 216 and uses these marks to phase the STS-48 frame so that data stored in one or more registers may be inserted into the proper time slots of the STS-48 frame. The mapper 214 may be adapted to insert A1, A2, and B1 bytes in the STS-48 formatted frame and then scramble any resulting data.

Functions of mapper 214 may be bypassed via connection 240. In this regard, one or more register associated with the multiple rate transceiver 202 may be configured to select a pass-through mode or a bypass mode of operation for the mapper 214. In bypass mode, for example, inbound OC-3/OC-12/OC-48 signals are not mapped by the mapper 214. However in the pass-through mode of operation, inbound OC-3/OC-12/OC-48 signals may be mapped to, for example, STS-48 signal by the mapper 214. Combined functions of the internal framer (INT FRMR) 216 and the mapper 214 may be bypassed via connection 238. In this regard, one or more register associated with the multiple rate transceiver 202 may be configured to select a pass-through mode or a bypass mode of operation for the combined functions of the internal framer (INT FRMR) 216 and the mapper 214. Combined functions of the internal framer (INT FRMR) 216, the mapper 214 and DEMUX 218 may be bypassed via connection 236. In this regard, one or more register associated with the multiple rate transceiver 202 may be configured to select a pass-through mode or a bypass mode of operation for the combined functions of the internal framer (INT FRMR) 216, the mapper 214 and the DMUX 218.

In one aspect of the invention, the functions of the internal framer may be a subset of the full framer. For illustrative purposes, a communication path including serial interface block 222, clock and data recovery (CDR) block 220, demultiplexer (DMUX) 218, internal framer (INT FRMR) 216, mapper 214, multiplexer (MUX) 212 and serial interface 224 may be a first outbound processing path. A communication path which may include serial interface block 222, clock and data recovery (CDR) block 220, demultiplexer (DMUX) 218, internal framer (INT FRMR) 216, mapper 214, multiplexer (MUX) 208 and serializer/deserializer (SERDES) interface (SFI-4) may be a second outbound processing path. The output of the serializer/deserializer (SERDES) interface (SFI-4) 206 comprising the first outbound communication path may be coupled to the full framer 204. In one aspect of the invention, the serializer/deserializer (SERDES) interface (SFI-4) 206 may be coupled to one or more of a plurality of slower speed devices. Accordingly, the serializer/deserializer (SERDES) interface (SFI-4) 206 may be configured to receive a single high speed serial data stream from the mapper 214 and deserializer the serial data stream into at least two or more parallel data streams having decreased data rates. These parallel data streams having slower data rates may be utilized by the slower speed devices. Advantageously, this may facilitate interconnectivity with slower speed devices.

The multiple rate transceiver 202 may also include a third communication path comprising serial interface 222, CDR 220, DMUX 232, 8B/10B decoder block 230, ten bit (10-bit) interface block (TBI) 228. This third communication path may not be critical to the practice of the invention, although the invention is not so limited. Notwithstanding, the output from the CDR 220 may be coupled to input of the DMUX 232. In this regard, the DEMUX 232 may be adapted to receive bit aligned data, which may be in a serial format, from the CDR 220. Upon receipt of the serial bit aligned data, the DMUX 232 may demultiplex the serialized data into a plurality of parallel data streams in order to decrease a data rate of the received inbound serialized data stream. The parallel output data streams from the DMUX 232 may be coupled to the 8B/10B decoder 230.

The 8B/10B decoder block 230 may be configured to perform error checks, which may include, but are not limited to, illegal code checks, disparity checks and invalid code checks. For example, there may be cases where both an illegal code and a running disparity error may cause an invalid code. In this case, an invalid code counter, which may be maintained for performance monitoring, may be incremented. The invalid code counter may be cleared upon a read access or other suitable method. The 8B/10B decoder block 230 may also be configured to handle certain decoding tasks within the multiple rate transceiver 202. A difference between the number of 1's and 0's in a block of data may be characterized as a running disparity (RD). A RD may be regarded as being positive when there are more ones (1s) than zeros (0s) and negative when there are more zeros (0s) than ones (1s). In an exemplary encoding scheme, each encoded 10-bit word may be assigned a RD of 0, +2, or −2, in order to ensure a high bit transition density for reliable clock recovery. Additionally, the RD encoding may be alternated for DC balancing. The balancing may be achieved by maintaining an equal number of ones (1s) and zeros (0s). Upon receipt of an invalid code, a decoder may replace the invalid code with an error code (/E/) K30.7, and may increment the invalid code counter. Upon receipt of a legitimate error code, /E/, the 8B/10B decoder block 230 may pass the error to an error handler (not shown) coupled to the 8B/10B decoder without incrementing the invalid counter.

Functions of the 8B/10B decoder block 230 may be bypassed via connection 234. In this regard, one or more register associated with the multiple rate transceiver 202 may be configured to select a pass-through mode or a bypass mode of operation for the 8B/10B decoder block 230. The output of the 8B/10B decoder block 230 may be coupled to the TBI interface 228. The output of the 8B/10B decoder block 230 may also be coupled to multiplexer 226. The multiplexer 226 may be adapted to receive a plurality of parallel data streams form the 8B/10B decoder block 230 and serialize the received plurality of parallel data streams. The output of the multiplexer 226 may be coupled to the serial interface 224 of the first communication.

Figure 3A:
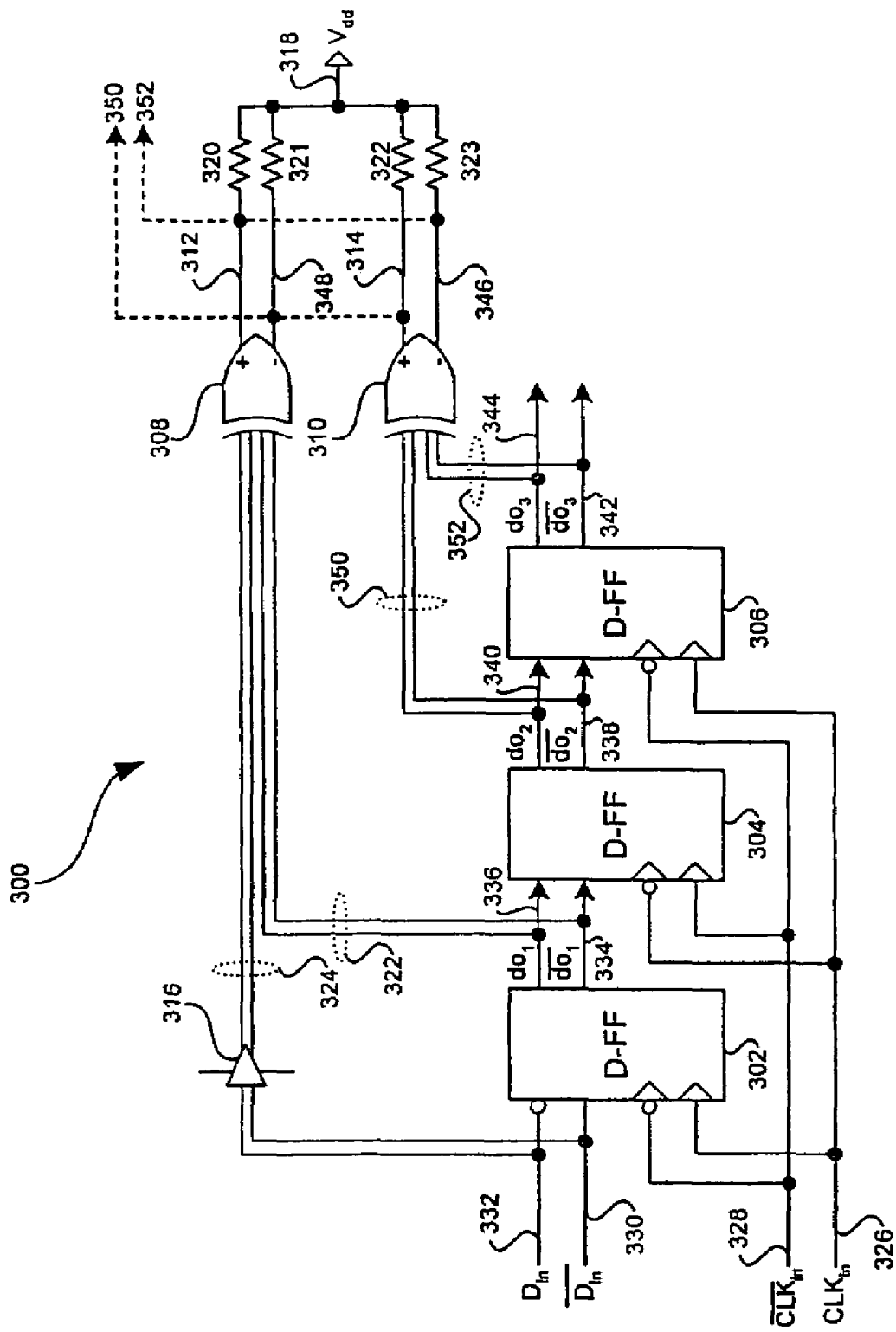
FIG. 3a is a block diagram of a conventional phase detector circuit that may be used by the CDR of FIG. 2.

FIG. 3a is a block diagram 300 of a conventional phase detector circuit that may be used by the CDR 220 of FIG. 2. The block diagram 300 of the conventional phase detector circuit represents a CDR Hogge differential phase detector. Referring to FIG. 3a, the block diagram shows D-FFs 302, 304, 306, exclusive OR (XOR) gates 308, 310, loading resistors 320, 321, 322 and 323 for the XOR's, delay buffer block 316 and various signals. These signals include differential data inputs including $D_{in}$ 332 and its complement $D_{in}$ (bar) 330, and differential clock inputs including $CLK_{in}$ 326 and its complement $CLK_{in}$ (bar) 328.

The D-FFs 302, 304, 306 are serially coupled so that the differential outputs $d_{o1}$ 336 of D-FF 302 and its complement $d_{o1}$ (bar) 334 are coupled to the inputs of D-FF 304. Specifically, the output $d_{o1}$ 336 and its complement $d_{o1}$ (bar) of the D-FF 302 are coupled to a negatively triggered inputs of the D-FF 304. Similarly the outputs $d_{o2}$ 340 of D-FF 304 and its complement $d_{o2}$ (bar) 338 are coupled to inputs of D-FF 306. Specifically, the output $d_{o2}$ 340 and its complement $d_{o2}$ (bar) 338 are coupled to a positively triggered inputs of the D-FF 306. Additionally, the complementary output $d_{o2}$ (bar) 338 of the D-FF 304 that corresponds to the complementary input $d_{o1}$ (bar) 334 is coupled to a positive triggered inputs of D-FF 306.

Differential data inputs $D_{in}$ 332 and its complement $D_{in}$ (bar) 330 are coupled to data inputs of the positively triggered D-FF 302. The output $d_{o3}$ 344 of D-FF 306 and its complement $d_{o3}$ (bar) 342 are coupled to inputs of XOR gate 310 as shown. The differential outputs $d_{o2}$ 340 and its complement $d_{o2}$ (bar) 338 of D-FF 304 are coupled to corresponding inputs of XOR gate 310 The differential clock input $CLK_{in}$ 326 and its complement $CLK_{in}$ (bar) 328 are the clock inputs for the positive edge triggered D-FF 302, the negative edge triggered D-FF 304, and the positive edge triggered D-FF 306.

Differential data inputs 324 including data input $D_{in}$ 332 and its complement $D_{in}$ (bar) 330 and the differential outputs 322 of D-FF 302, are coupled to respective inputs of XOR gate 308. The differential outputs 322 of D-FF 302 include $d_{o1}$ 336 and its complement $d_{o1}$ (bar) 334. An optional buffer 316 is coupled between the differential inputs $D_{in}$ 332, $D_{in}$ (bar) 330 and the inputs of the XOR gate 308.

A first positive output 314 of the XOR gate 310 is coupled to one node of the first resistor 322. A second negative output 346 of XOR gate 310 is coupled to one node of a second resistor 323. The second negative output 346 of XOR gate 310 is the complement of the output signal 314. A first positive output 312 of the XOR gate 308, is coupled to one node of a third resistor 320. A second negative output 348 of XOR gate 308, is coupled to one node of a fourth resistor 321. The second negative output 348 of XOR gate 308 is the complement of the first positive output 312 of the XOR gate 308. The other nodes of the first resistor 322, the second resistor 323, the third resistor 320 and the fourth resistor 321 are tied together and coupled to $V_{dd}$ 318.

Figure 3B:
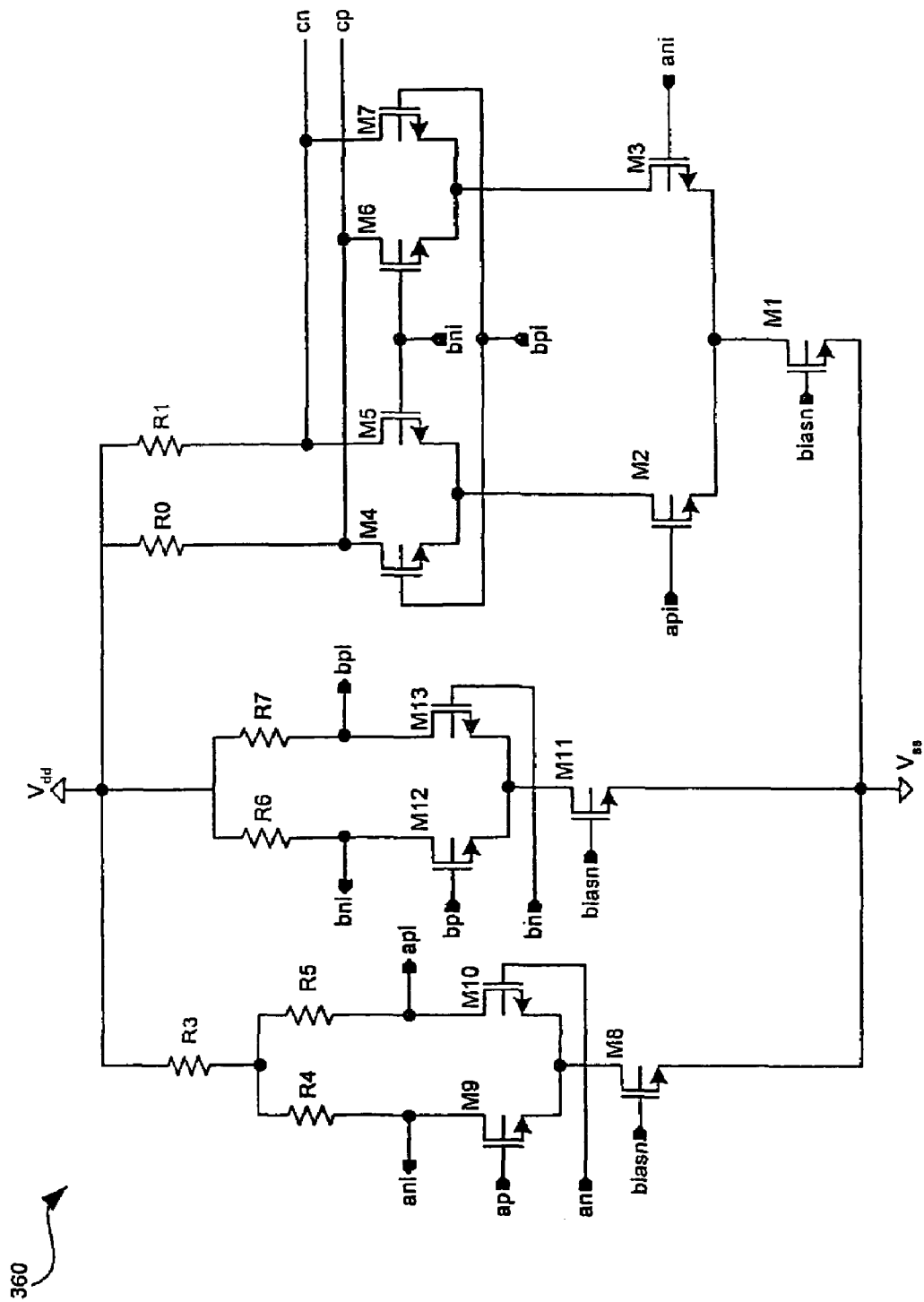
FIG. 3b is a block diagram of a conventional two-level XOR gate.

Due to the coupling arrangements of FIG. 3b, the XOR gate 308 of the phase detector may be referred to as a data XOR gate and the XOR gate 310 may be referred to as a reference XOR. The optional delay buffer block 316 is adapted to match a propagation delay through the D-FF arrangement with a propagation delay of the differential data input signal $D_{in}$ 332. The resistive loads which includes the first resistor 322, the second resistor 323, the third resistor 320 and the fourth resistor 321 may be coupled to, for example, power supply rails or other DC bias such as $V_{dd}$ 318. The D-FFs 302, 304 are coupled to the data inputs $D_{in}$ 330 and its complement $D_{in}$ (bar) 330, so that D-FF 304 is triggered one half (½) clock cycle behind D-FF 302. Similarly, D-FFs 302, 304, 306 are coupled to the data inputs $D_{in}$ 330 and its complement Din (bar) 330, so that D-FF 306 is triggered one half (½) clock cycle behind D-FF 304. In this regard, the differential output of D-FF 306 are one full clock cycle behind that of D-FF 302.

The inputs 324 and 322 are coupled to the XOR gate 308 so that they provide staggered or delayed input signals to the XOR gate 308. Similarly, the inputs 350 and 352 coupled to the XOR gate 310 so that they provide staggered or delayed input signals to the XOR gate 310. Moreover, the inputs 350, 352 to the XOR gate 308 are staggered with respect to the inputs 324, 322 to the XOR gate 308. To ensure proper operation, the first positive output 312 of the XOR gate 308 and the second negative output 346 of the XOR gate 310 are shorted (or through certain resistance) to form a positive output 352 of the detector. Additionally, the second negative output 348 of the XOR gate 308 and the first positive output 314 of the XOR gate 310 are shorted (or through certain resistance) to form a negative output 350 of the detector. Accordingly, when the two pairs of the differential inputs of the XOR gates 308, 310 are of the same logic value, there will be no current flowing through resistor 321 and resistor 323. Consequently, there will be current flowing through resistors 320 and 322. In all other instances, there will be current flowing through 321 and 323 and no current through 320 and 322. For example, when transitions occur at $D_{in}$ 332 and its complement $D_{in}$ (bar) 330, then current will flow through resistors 321 and 323.

After shorting the first positive output 312 and the second negative output 346, and also the second negative output 348 and the first positive output 314, the differential coupling arrangement of the input clock $CLK_{in}$ 328 and the data input $D_{in}$ to the D-FFs 302, 304, 306 may permit a predictable output pulse width. Particularly, an output current pulse width of the reference XOR gate 310 may be one-half (½) of the clock period. In a case where the clock signal $CLK_{in}$ 326 and/or its complementary signal $CLK_{in}$ (bar) 328 is located in the middle of the data eye, an output pulse width of the data XOR 308 may be equivalent to the output pulse width of the reference XOR 310.

FIG. 3b is a block diagram 360 of a conventional two-level XOR gate. Referring to FIG. 3b, there is shown a plurality of transistors M1, M2, M3, M4, M5, M6, M7, M8, M9, M10, M11, M12, M13 and M14 variously coupled to create a two-level XOR gate. The two-level XOR may be utilized by the conventional differential phase detector of FIG. 3a in place of the data XOR gate 308 and the load resistors 320 and 321 or the reference XOR gate 310 and the load resistors 322 and 323. The exemplary XOR gate may also include input signals ap, an, bp, bn and output signals cn and cp. The transistors M1, M2, M3, M4, M5, M6 and M7 form the main circuit of the XOR gate. The transistors M1, M2, M3, M4, M5, M6, M7, M8, M9, M10, M11, M12, M13 and M14 are all NMOS transistors.

Transistors M8, M9 and M10 are arranged to form a first differential pair. The sources of transistors M9 and M10 are tied together and coupled to a drain of transistor M8. Input signals ap and an are coupled to the gates of transistors M8 and M10, respectively. A bias input signal biasn is coupled to a gate of transistor M8 and is used to bias transistors M9 and M10. A drain of transistor M9 functions as an output signal ani and a drain of transistor M10 functions as an output signal api. The drain of transistor M9 is coupled to a first node of a resistor R4. Similarly, the drain of transistor M9 is coupled to a first node of a resistor R5. A second node of resistor R4 is coupled to a second node of resistor R5. The coupled second nodes of resistors R4, R5 are coupled to a first node of resistor R3 and a second node of resistor R3 is coupled to a DC bias such as $V_{dd}$.

Transistors M11, M12 and M13 are arranged to form a second differential pair. The sources of transistors M12 and M13 are tied together and coupled to a drain of transistor M11. Input signals bp and bn are coupled to the gates of transistors M12 and M13, respectively. The bias input signal biasn is also coupled to a gate of transistor M11 and is used to bias transistors M12 and M13. A drain of transistor M12 functions as an output signal bni and a drain of transistor M13 functions as an output signal bpi. The drain of transistor M12 is coupled to a first node of a resistor R6. Similarly, the drain of transistor M13 is coupled to a first node of a resistor R7. A second node of resistor R6 is coupled to a second node of resistor R7. The coupled second nodes of resistors R6 and R7 are coupled to the DC bias $V_{dd}$.

Transistors M4, M5 and M2 are arranged to form a third differential pair. The sources of transistors M4 and M5 are tied together and coupled to a drain of transistor M2. The drain of transistor M4 functions as a positive output cp and the drain of transistor M5 functions as a negative output cn. A drain of transistor M4 is coupled to a first node of a resistor R0. Similarly, the drain of transistor M5 is coupled to a first node of a resistor R1. A second node of resistor R0 is coupled to a second node of resistor R1. The coupled second nodes of resistors R0 and R1 are coupled to the DC bias $V_{dd}$. The output signal api from the drain of transistor M10 is coupled to the gate of transistor M2.

Transistors M6, M7 and M3 are also arranged to form a fourth differential pair. The sources of transistors M6 and M7 are tied together and coupled to a drain of transistor M3. The drain of transistor M6 is coupled to the drain of transistor M4, which functions as the positive output cp. The drain of transistor M7 is coupled to the drain of transistor M5, which functions as the negative output cn. A gate of transistor M7 is coupled to the gate of transistor M4. The coupled gates of the transistors M4 and M7 are coupled to the drain of transistor M13, the latter of which functions as the signal bpi. A gate of transistor M5 is coupled to the gate of transistor M6. The coupled gates of the transistors M5 and M6 are coupled to the drain of transistor M12, the latter of which functions as the signal bni.

Transistors M2, M3 and M1 are also arranged to form a fifth differential pair. The sources of transistors M2 and M3 are tied together and coupled to a drain of transistor M1. The drain of transistor M3 is coupled to the sources of transistors M6 and M7 that are tied together. Similarly, the drain of transistor M2 is coupled to the sources of transistors M4 and M5 that are tied together. The source of transistor M1, the source of transistor M11 and the source of transistor M8 are all coupled together. The bias signal, biasn, is coupled to a gate of the transistor M1. The gate of transistor M2 is coupled to the drain of transistor M10, the latter of which is the positive input signal api. The gate of transistor M3 is coupled to the drain of transistor M9, the latter of which is the negative input signal ani. The third, fourth and fifth differential pair arrangements function as the main XOR circuit.

The fist differential pair and the second differential pair function as signal conditioners for the main XOR circuit. The first differential pair comprising M8, M9 and M10 provides a first pair of input signals ani and api to the main XOR circuit. The second differential pair comprising M11, M12 and M13 provides a second pair of input signals bni and bpi to the main XOR circuit. The signal ani represents the first negative input signal and the signal api represents the first positive input signal. The signal bni represents the second negative input signal and the signal bpi represents the second positive input signal. In this configuration, the first and the second differential pairs provide two common-mode DC levels.

The resistors R0 and R1 in the main XOR circuit correspond to the load resistor 320 and 321 of FIG. 3a. Similarly, the resistors R0 and R1 in the main XOR circuit may also correspond to the load resistor 322 and 323 of FIG. 3a. Inputs ani and api correspond to the data inputs 424 and inputs bni and bpi correspond to data inputs 322 of FIG. 3a. Referring to FIG. 3b, whenever the inputs api and bpi are of the same logic level (both low or both high), current will flow through resistor R0 and the output cp will be low. In this case no current will flow through resistor R1 and the output cn will be high. When the input api and bpi are of opposite logic levels (one high, the other low) current will flow through resistor R1 and output cn will be low, and no current will flow through resistor R0 and output cp will be high. In this manner, the XOR functions as indicated in the following table.

| (ap, bp) | $i_{cp}$ | $i_{cn}$ | cp-cn |
| --- | --- | --- | --- |
| (0, 0) | yes | no | 0 |
| (0, 1) | no | yes | 1 |
| (1, 0) | no | yes | 1 |
| (1, 1) | yes | no | 0 |

The currents through resistors R0 and R1 are represented by $i_{cp}$, $i_{cn}$ respectively.

Accordingly, with reference particularly to FIG. 3a and FIG. 3b, it is readily observed that there is current flowing through 320, 321, 322 and 323 when the differential inputs for each XOR have the same logic level. Although the substrates of the transistors are illustrated floating, the substrates of each of the transistors may be coupled to Vss, or to a certain bias and to a corresponding transistor source if the transistor has its own isolated p-well.

Figure 4A:
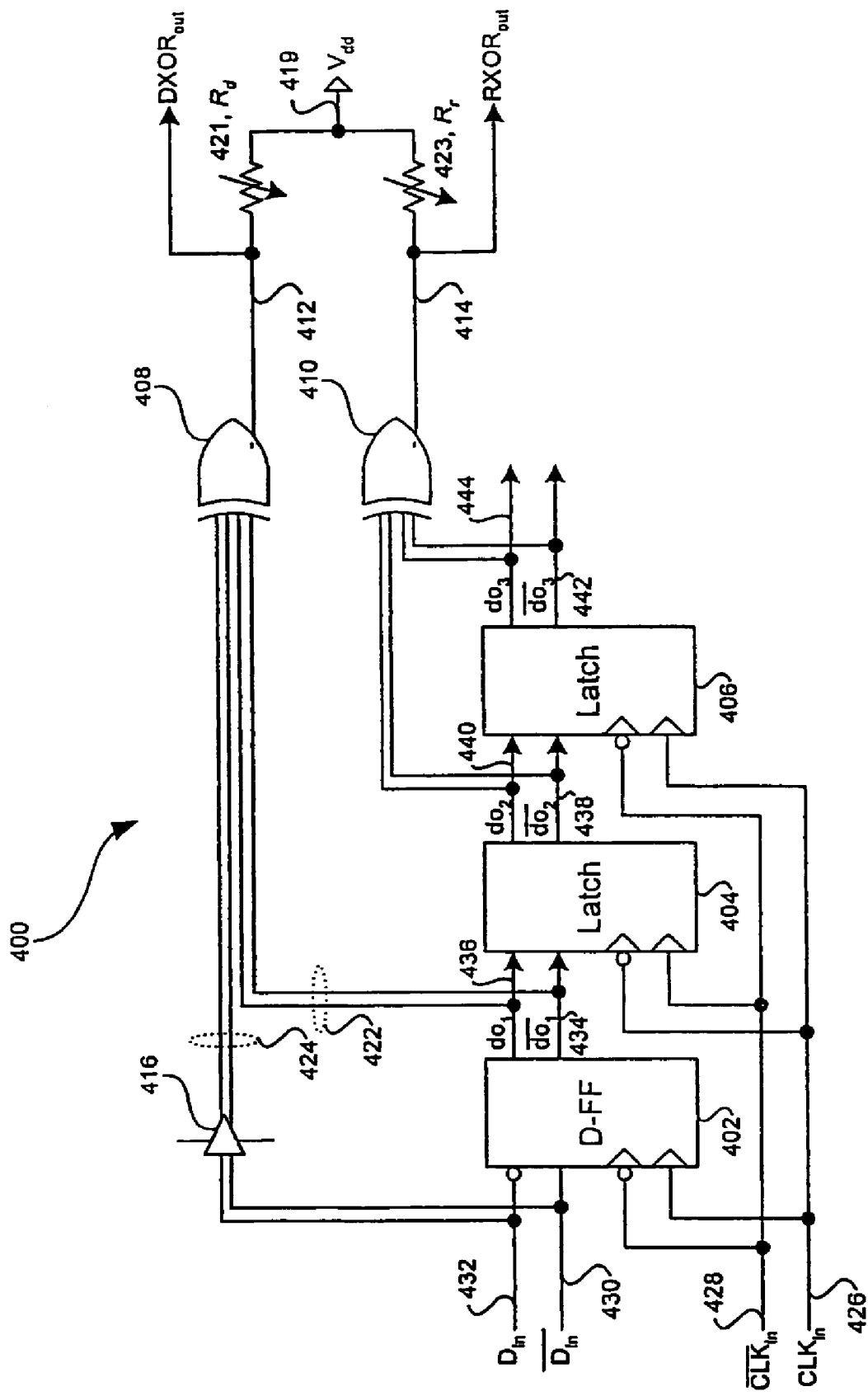
FIG. 4a is a block diagram of a phase detector circuit that may be utilized by the CDR of FIG. 2 in accordance with an embodiment of the invention.
Figure 4B:
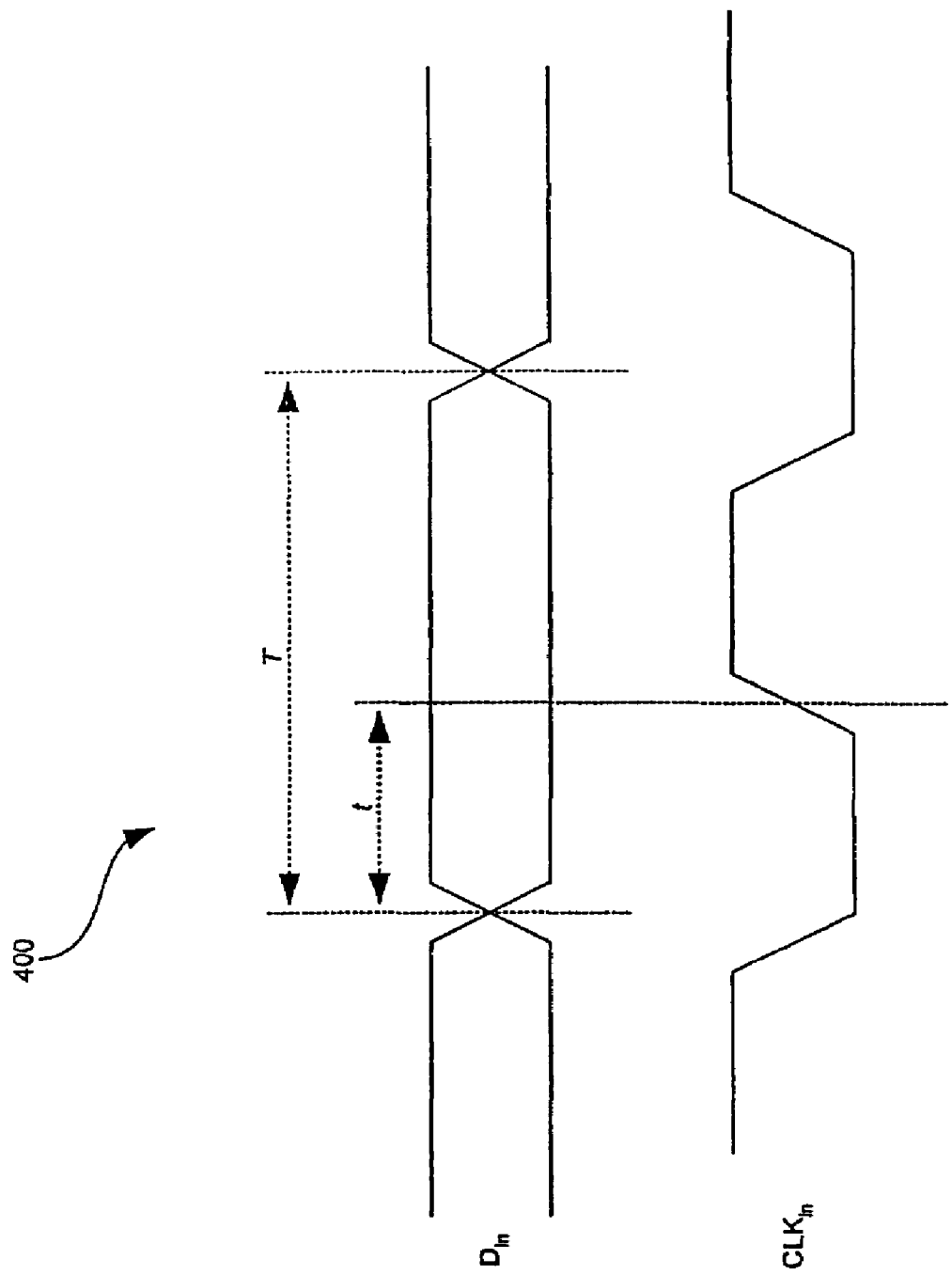
FIG. 4b is a corresponding timing diagram for the phase detector circuit of FIG. 4a in accordance with an embodiment of the invention.

FIG. 4a is a block diagram 400 of a phase detector circuit that may be utilized by the CDR 220 of FIG. 2 in accordance with an embodiment of the invention. FIG. 4b is a corresponding timing diagram for the phase detector circuit of FIG. 4a in accordance with an embodiment of the invention. Referring to FIG. 4a, the phase detector circuit of block diagram 400 utilizes a first latch 404 in place of the D-FF 304 utilized in the conventional system of FIG. 3a. Similarly, the phase detector circuit of block diagram 400 utilizes a second latch 406 in place of the D-FF 306 utilized in the conventional system of FIG. 3a. Moreover, the invention utilizes only the negative inputs of each of the XOR gates 408, 410, each of which are coupled to a first node of a variable resistors 421, 423 respectively. A second node of each of the resistors 421, 423 may be coupled to $V_{dd}$ 419. Accordingly, the ouput 412 of the XOR gate 408 may function as the data output $DXOR_{out}$ and ouput 414 of the XOR gate 410 may function as the reference output $RXOR_{out}$. Variation of the load resistances 421 and 423 may be realized in many ways, for example, by switching in/out parallel resistors to lower/higher the overall load resistance or by using a MOS transistor with its gate controlled by certain control voltage.

In accordance with an embodiment of the invention, with reference to both FIG. 4a and FIG. 4b, phase alignment and adjustment between the differential data $D_{in}$ and differential clock $CLK_{in}$ may be realized by using only the negative outputs of XOR's 408 and 410 and changing the resistance ratio between resistors 421 and 423. In operation, whenever the inputs of each of the XOR gates have the same logic level, there will be no current flowing through resistors 421 and 423. Therefore the voltage levels at $DXOR_{out}$ and $RXOR_{out}$ may be maintained at the same as $V_{dd}$ regardless of the resistance value of resistors 421 and 423. However, in instances where data transitions occur, the inputs of the data XOR gate 408 will have different logic levels for a period of time, t, depending on the clock and the data phase alignment, ranging from 0 to a full bit period T. In this regard, current will flow through resistor 421 for that period of time. In instances when there may be data transitions, the inputs of the reference XOR 410 will have different logic levels for one half of the bit period regardless of Din and $Clk_{in}$ alignment. Accordingly, current will flow through resistor 423 for that half bit period. However, after the CDR loop reaches a steady state, the phase alignment between the input data $D_{in}$ and the triggering clock $CLK_{in}$, may be expressed by the following equation:

$$t \cdot R_d = \frac{T}{2} \cdot R_r, \text{ and } t = \frac{T}{2} \cdot \frac{R_r}{R_d}$$

$R_d$ represents the resistance of 421, $R_r$ the resistance of 423 and T the bit period or clock period. In this regard, there is no pattern density involved in determination of phase alignment, thus the phase alignment is data pattern independent. By changing the resistance ratio of resistors 421 and 423, the phase alignment between the data $D_{in}$ and the triggering clock $CLK_{in}$ may be changed, thereby resulting in the so-called pattern-independent phase adjustment.

In accordance with various aspects the invention, the phase detector circuit of diagram 400 provides no current flow at the outputs $DXOR_{out}$ and $RXOR_{out}$ when there is no data transition. The invention overcomes disadvantages of prior art systems and methods which have current flowing at the output when there are no data transitions, thereby making it difficult to properly accomplish pattern-independent phase adjustment. According to certain aspects of the invention, when there are no transitions, the outputs of the phase detector circuit of diagram 400 are both equal to $V_{dd}$ since no current flows through the output resistor from the voltage source, $V_{dd}$. In the case that current flows through the output resistor from the voltage source, $V_{dd}$, there will be voltage drop on the resistor, the output potential will be low, lower than $V_{dd}$.

One disadvantage associated with the conventional two-level XOR gate of FIG. 3b is that it may be slow due to the propagation path of the differential signals. For example, differential signals api and ani utilizes two levels of transistor stack to propagate to the outputs cp and cn. Accordingly, the conventional two level XOR gate of FIG. 3b may not offer an efficient practical solution for high speed applications such as 10 gigabit SONET and Ethernet applications.

Figure 5:
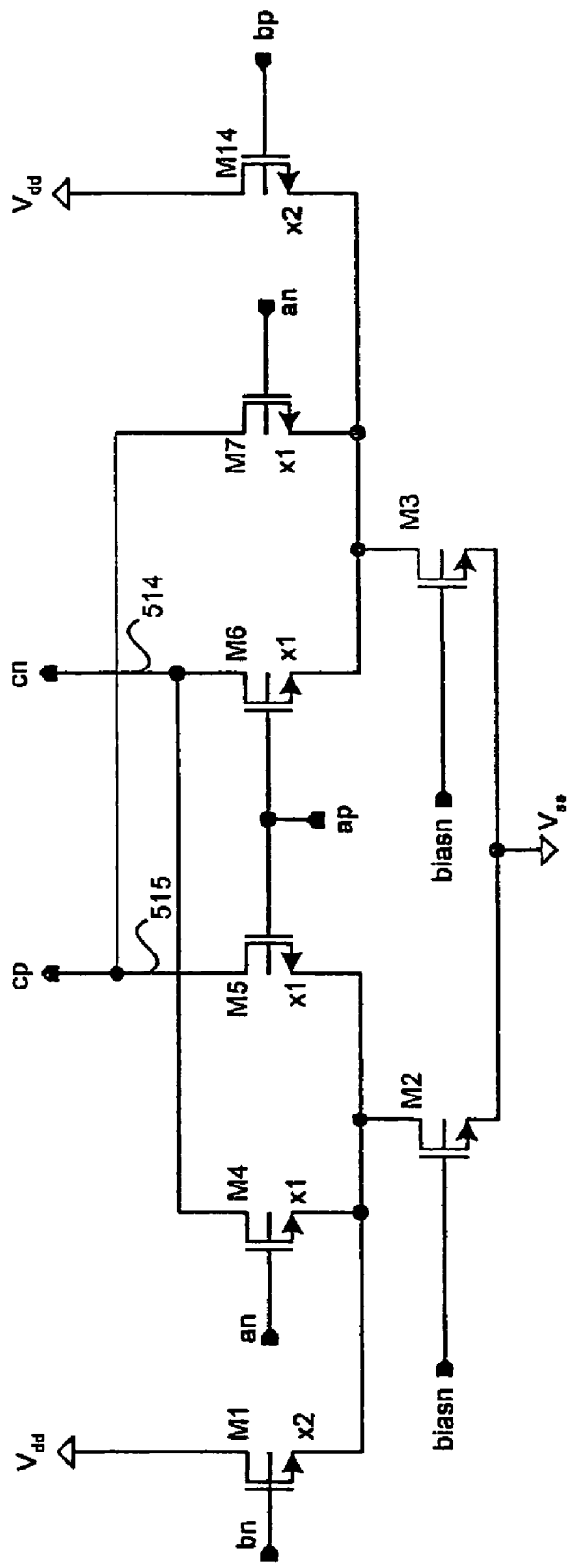
FIG. 5 is a block diagram of a conventional one-level XOR with the two pairs of differential inputs ap, an, bp, bn having the same high or low level.

FIG. 5 is a block diagram of a conventional one-level XOR with the two pairs of differential inputs ap, an, bp, bn having the same high or low level. Referring to FIG. 5, there is shown a plurality of transistors M1, M2, M3, M4, M5, M6, M7 and M14 variously coupled as illustrated to create a one-level XOR gate. The one-level XOR gate may be utilized by the differential phase detector of FIG. 3a as the data XOR gate and/or the reference XOR gate. The exemplary one-level XOR gate of FIG. 5 may also include input signals ap, an, bp, bn and output signals cn and cp. The transistors M1, M2, M3, M4, M5, M6, M7 and M14 are all NMOS transistors.

Transistors M4, M5 and M2 are arranged to form a first differential pair. The sources of transistors M4 and M5 are tied together and coupled to a drain of transistor M2. The drain of transistor M4 may be coupled to the drain of transistor M6. An negative output cn may be coupled to the coupled drains of transistors M4 and M6. A drain of transistor M5 and a drain of transistor M7 may be coupled to the DC bias $V_{dd}$ or a positive power supply. The input signal an may be coupled to the gate of transistor M4. The input signal ap may be coupled to the gate of transistor M5. A source of transistor M1 may be coupled to the sources of transistors M4 and M5 that are tied together. A drain of transistor M1 may be coupled to the DC bias $V_{dd}$. A gate of transistor M1 functions as the negative input bn to the one-level XOR gate. A bias input signal, biasn, may be coupled to a gate of transistor M2 and a gate of transistor M3.

Transistors M6, M7 and M8 may be arranged to form a second differential pair. The sources of transistors M6 and M7 are tied together and coupled to a drain of transistor M3. A drain of transistor M7 and a drain of transistor M5 may be coupled to the output cp. The input signal an may be coupled to the gate of transistor M7. The input signal ap may be coupled to the gate of transistor M6. A source of transistor M14 may be coupled to the sources of transistors M6 and M7 that are tied together. A drain of transistor M14 may be coupled to the DC bias $V_{dd}$. A gate of transistor M14 functions as the second positive input bp to the the one-level XOR gate.

In the conventional one-level XOR gate of FIG. 5, all the crucial switching NMOS transistors are at the same transistor stack level, which results in the trem one-level. Accordingly, the resulting one-level XOR gate is faster than conventional two-level XOR gates since the added stack level in the conventional XOR gates reduces its speed, making it slower than a one-level XOR gate. Notwithstanding, even with a reasonable transistor size ratio between transistors M1, M14 and M4, M5, M6 and M7, there is still a significant amount of current flowing through branch 514 when the two pairs of differential inputs are of the same logic level.

Figure 6:
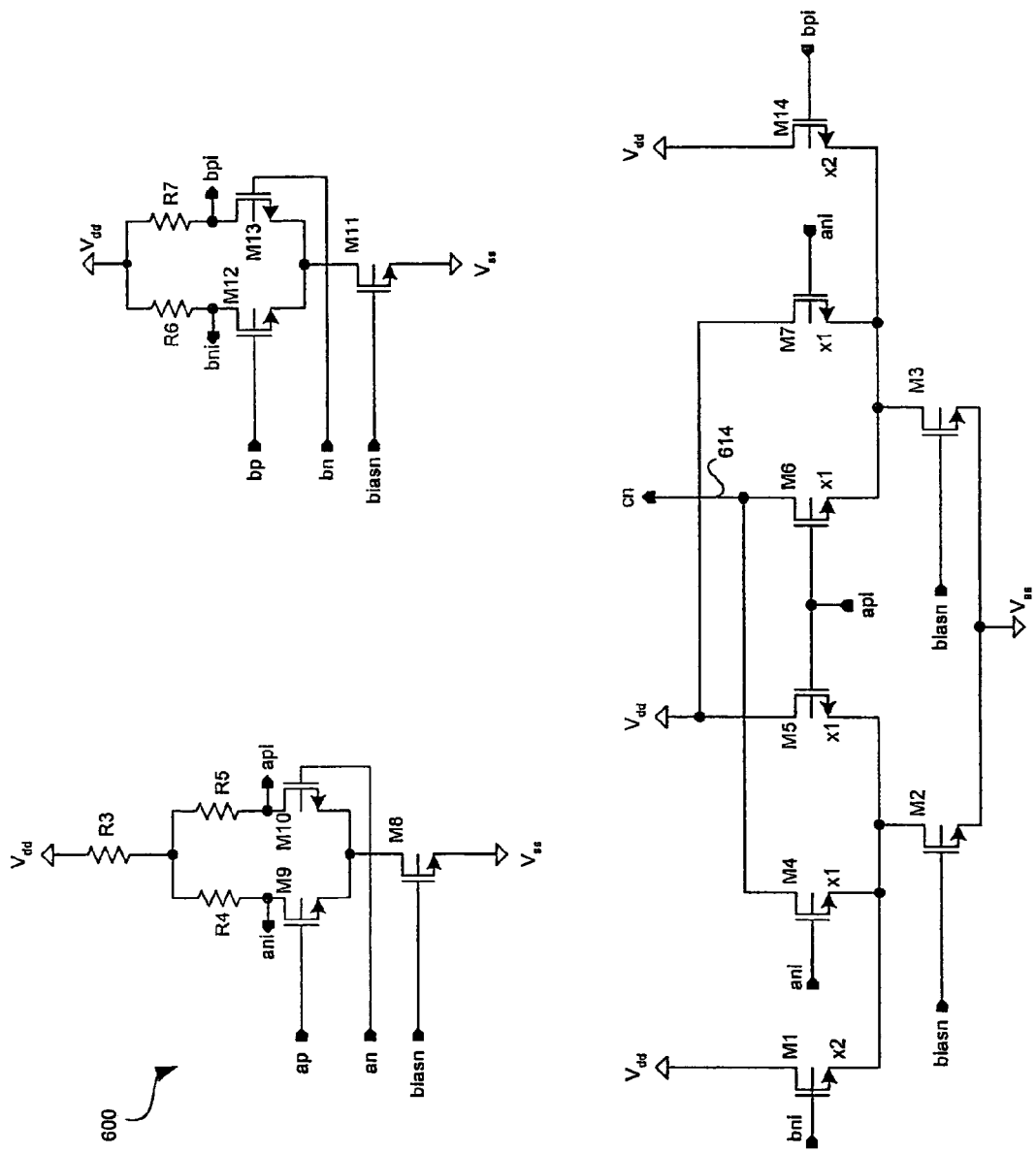
FIG. 6 is a block diagram of a one-level zero-current-state XOR gate in accordance with an embodiment of the invention.

In accordance with an embodiment of the invention, a fast phase detector with pattern independent phase adjustment may be provided by combining the one-level XOR of FIG. 6 with the phase detector implementation shown in FIG. 4a. FIG. 6 is a block diagram 600 of a one-level zero-current-state XOR gate in accordance with an embodiment of the invention. Referring to FIG. 6, there is shown a plurality of transistors M1, M2, M3, M4, M5, M6, M7, M8, M9, M10, M11, M12, M13 and M14 variously coupled as illustrated to create a one-level zero-current-state XOR gate. The one-level zero-current-state XOR may be utilized by the differential phase detector of FIG. 4a as the data XOR gate 408 or the reference XOR gate 410. The exemplary one-level XOR gate of FIG. 6 may also include input signals ap, an, bp, bn and output signals cn. The transistors M1, M2, M3, M4, M5, M6, M7 and M14 form the main circuit of the one-level zero-current-state XOR gate. The transistors M1, M2, M3, M4, M5, M6, M7, M8, M9, M10, M11, M12, M13 and M14 are all NMOS transistors.

Transistors M8, M9 and M10 are arranged to form a first differential pair. The sources of transistors M9 and M10 are tied together and coupled to a drain of transistor M8. Differential Input signals ap and an may be coupled to the gates of transistors M9 and M10, respectively. A bias input signal biasn may be coupled to a gate of transistor M8 and may be utilized to bias transistors M9 and M10. The bias input signal biasn may be also coupled to a gate of transistor M11, a gate of transistor M2 and a gate of transistor M3. An output signal ani may be coupled to a drain of transistor M9 and an output signal api may be coupled to a drain of transistor M10.

The drain of transistor M9 may be coupled to a first node of a resistor R4. Similarly, the drain of transistor M10 may be coupled to a first node of a resistor R5. A second node of resistor R4 may be coupled to a second node of resistor R5. The coupled second nodes of resistors R4, R5 are coupled to a first node of resistor R3 and a second node of resistor R3 is coupled to a DC bias such as $V_{dd}$. The resistor R3 may be referred to as a level shifting resistor R3 and provides a substantial voltage drop. Although the substrates are shown floating, they may be coupled to a certain bias. This bias may be $V_{ss}$ or its corresponding source if the NMOS transistor has its own isolated p-well. Alternatively, the substrates may be coupled to other bias voltage. The level shifting resistor R3 may be integrated as part of the one-level zero-current-state XOR gate within a chip.

Transistors M12, M13 and M11 are arranged to form a second differential pair. The sources of transistors M12 and M13 are tied together and coupled to a drain of transistor M11. Differential Input signals bp and bn may be coupled to the gates of transistors M12 and M13, respectively. The transistor M11 may be utilized to bias transistors M12 and M13. An output signal bni may be coupled to a drain of transistor M12 and an output signal bpi may be coupled to a drain of transistor M13.

The drain of transistor M12 may be coupled to a first node of a resistor R6. Similarly, the drain of transistor M13 may be coupled to a first node of a resistor R7. A second node of resistor R6 may be coupled to a second node of resistor R7. The coupled second nodes of resistors R6, R7 are connected to a DC bias such as $V_{dd}$.

Referring to FIG. 6, in an embodiment of the invention, the core or main circuit of the one-level zero-current-state XOR gate may include transistors M1, M4, M5, M2, M3, M6, M7 and M14. The signal ap may represent the first positive input, an a first negative input, bp a second positive input and bn a second negative input. Each of the first differential pair and the second differential pair may be designed to produce a different high voltage level between api, ani and bpi, bni. For example, for the first differential pair comprising transistors M8, M9 and M10, a level shifting resistor may be placed between $V_{dd}$ and R4, R5. Accordingly, the high voltage level for api and ani may be given by:

$$V_{dd} - I_{M8} \cdot R3.$$

The DC current through the drain of M8 is equal to that of R3. For the second differential pair, the high voltage level for bpi and bni is $V_{dd}$. Accordingly, if the voltage drop $I_{M8} \cdot R3$ is high enough and api, ani, bpi and bni have the same low level, in circumstances when the two pairs of differential inputs ap and bp are at the same logic level, the drains of transistor M4 and M6 which are coupled to the output branch 614 and the output cn will be cut off. Accordingly, there is no current through the output branch 614 and the output cn.

To achieve the same low level for the four signals, api, ani, bpi and bni, the first and second differential pairs may be designed such that the following equation is satisfied:

$$I_{M8} \cdot (R3+R4) = I_{M11} \cdot R6.$$

However, since the value of resistor R5 may be equal to the value of resistor R4, and the value of resistor R7 is equal to the value of resistor R6, the following equation may also be satisfied:

$$I_{M8} \cdot (R3+R5) = I_{M11} \cdot R7,$$

where $I_{M11}$ is the current through transistor M11. The term zero-current-state is derived from the fact that there is no current flowing through branch 614 when the two differential inputs ap and an have the same logic level.

In an embodiment of the invention, the values of the transistors in the main or core XOR circuit may be designated so that the size of M1 is about twice (×2) that of M4, M5, M6 and M7. Similarly, the size of M14 may be about twice (×2) that of M7, M6, M5 and M4. For illustrative purposes, the sizes of transistors M4, M5, M6 and M7 may be represented by ×1. In this regard, the size of transistors M4, M5, M6 and M7 may be about the same. However, the invention is not so limited and other ratio may be chosen.

Accordingly, the present invention may be realized in hardware, software, or a combination of hardware and software. The present invention may be realized in a centralized fashion in one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention also may be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A system for exclusive-or (XOR) signaling comprising:
a first differential circuit with a first set of voltage levels;
a second differential circuit with a second set of voltage levels;
a core XOR circuit responsive to said first set of voltage levels and said second set of voltage levels; and
a level-shifting resistance selectable to adjust said first set of voltage levels, wherein said level-shifting resistance is selectable such that an output current of said core XOR circuit is substantially zero and a current in said level-shifting resistance is substantially maintained.

2. The system of claim 1 wherein said level-shifting resistance is selectable such that a power dissipation of said first differential circuit is substantially maintained.

3. The system of claim 1 wherein said first set of voltage levels comprises levels corresponding to a first logic HIGH and first logic LOW, and said second set of voltage levels comprises levels corresponding to a second logic HIGH level and a second logic LOW level.

4. The system of claim 3 wherein said level-shifting resistance is selectable such that said levels corresponding to said first logic LOW level and said second logic LOW level are substantially equal.

5. The system of claim 3 wherein said level-shifting resistance is selectable such that said level corresponding to said first logic HIGH level is less than said level corresponding to said second logic HIGH level.

6. The system of claim 1 wherein switching transistor in said core XOR circuit are on one transistor stack level.

7. The system of claim 1 further comprising a propagation delay for recovering a clock portion of a signal with a bandwidth of approximately 10 gigabits/second.

8. The system of claim 1 comprising circuitry that receives at least two input signals and generates an output signal, and a load coupled to said output signal, wherein substantially no current flows through said load when said at least two input signals each represent a same logic level.

9. An apparatus for exclusive-or (XOR) signaling comprising:
at least two differential circuits, each said differential circuit comprising output signal levels, and at least one of said differential circuit output signal levels adjustable with respect to other of said output signal levels such that a current of an output signal of said core XOR circuit is substantially zero; and
a one-level core XOR circuit responsive to said output signal levels.

10. The apparatus of claim 9 comprising a propagation delay for recovering a clock portion of a signal with a bandwidth of approximately 10 gigabits/second.

11. The apparatus of claim 9 wherein said one-level core XOR circuit comprises a plurality switching transistors on one transistor stack level.

12. The apparatus of claim 9 wherein a first of said differential circuits comprises said output signal levels corresponding to a first logic HIGH level and first logic LOW level, and wherein a second of said differential circuits comprises said output signal levels corresponding to a second logic HIGH level and a second logic LOW level.

13. The apparatus of claim 12 wherein at least one of said output signal levels of said first and second differential circuits is adjustable such that said levels corresponding to said first logic LOW level and said second logic LOW level are substantially equal.

14. The apparatus of claim 12 wherein at least one of said output signal levels of said first and second differential circuits is adjustable such that said level corresponding to said first logic HIGH level is less than said level corresponding to said second logic HIGH level.

15. A method for providing exclusive-or (XOR) signaling comprising:
generating a first signal from a first differential circuit;
generating a second signal from a second differential circuit;
generating an output signal from a core XOR circuit responsive to said first signal and said second signal; and
utilizing a level-shifting resistance that effects output voltages of said first signal, wherein said level-shifting resistance is selectable such that an output current of said output signal is substantially zero and a current through said level-shifting resistance is substantially maintained.

16. The method of claim 15, wherein said level-shifting resistance is selectable from a variety of resistances without substantially changing power dissipation of said first differential circuit.

17. The system of claim 15, wherein said differential circuits and said core XOR circuit comprise a propagation delay for recovering a clock portion of a signal with a bandwidth of approximately 10 gigabits/second.

18. The method of claim 15, wherein said first signal comprises a first HIGH level and first LOW level, and said second signal includes a second HIGH level and a second LOW level.

19. The method of claim 18, wherein said level-shifting resistance is such that said first LOW level and said second LOW level are substantially equal.

20. The system of claim 18, wherein said level-shifting resistance is such that said first HIGH level is less than said second HIGH level.

* * * * *